(12) United States Patent
Mclaren et al.

(10) Patent No.: US 10,177,714 B1
(45) Date of Patent: Jan. 8, 2019

(54) MULTIPLE-RESONATOR CIRCUITS AND DEVICES

(71) Applicant: NXP USA, Inc., Austin, TX (US)

(72) Inventors: Roy Mclaren, Gilbert, AZ (US); Eric Johnson, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/793,393

(22) Filed: Oct. 25, 2017

(51) Int. Cl.
| | |
|---|---|
| *H03F 1/02* | (2006.01) |
| *H03D 7/14* | (2006.01) |
| *H03F 3/195* | (2006.01) |
| *H03J 3/20* | (2006.01) |
| *H03D 7/16* | (2006.01) |
| *H03F 1/08* | (2006.01) |
| *H03H 9/64* | (2006.01) |

(52) U.S. Cl.
CPC ......... *H03F 1/0288* (2013.01); *H03D 7/1441* (2013.01); *H03D 7/165* (2013.01); *H03F 1/083* (2013.01); *H03F 3/195* (2013.01); *H03H 9/6433* (2013.01); *H03J 3/20* (2013.01)

(58) Field of Classification Search
CPC ...................................................... H03F 1/0288
See application file for complete search history.

(56) References Cited

U.S. PATENT DOCUMENTS

| | | | |
|---|---|---|---|
| 5,272,450 A | 12/1993 | Wisherd | |
| 5,568,095 A * | 10/1996 | Hill | G08C 17/02 331/107 A |
| 7,042,294 B2 | 5/2006 | Goss | |
| 7,932,777 B1 * | 4/2011 | Zipfel, Jr. | H02N 2/065 330/10 |
| 9,960,795 B1 * | 5/2018 | Liu | H03F 3/19 |
| 2004/0008094 A1 * | 1/2004 | Niemi | H03F 3/72 333/101 |
| 2008/0001660 A1 * | 1/2008 | Rasmussen | H03F 1/3247 330/10 |
| 2013/0331048 A1 * | 12/2013 | Tombak | H03F 3/45076 455/127.2 |
| 2015/0340991 A1 * | 11/2015 | Lin | H03F 1/0205 455/127.1 |

* cited by examiner

*Primary Examiner* — Patricia T Nguyen

(57) ABSTRACT

A circuit includes a first amplifier path configured to carry a first radio frequency signal, a second amplifier path configured to carry a second radio frequency signal, a first resonator connected to the first and second amplifier paths, the first resonator being configured to resonate at a radio frequency to isolate the first and second radio frequency signals from one another and further configured to pass signals at a baseband frequency, and a second resonator coupling the first resonator and a reference voltage node, the second resonator being configured to pass signals at the baseband frequency to the reference voltage node.

20 Claims, 7 Drawing Sheets

MULTIPLE-RESONATOR CIRCUITS AND DEVICES

FIELD OF INVENTION

The present embodiments relate to resonators, and more particularly to resonator circuits and devices used in radio frequency power amplifiers.

BACKGROUND

Power amplifiers exhibit non-linear behavior in the presence of amplitude-modulated radio frequency (RF) signals. The non-linear behavior produces distortion products. For many RF transmitter applications, linearization schemes are used to reduce power amplifier distortion sufficiently to meet system requirements for co-channel interference. Digital pre-distortion is a commonly employed linearization scheme. In digital pre-distortion, the input signal to the power amplifier is pre-distorted in such a manner that the input signal to the power amplifier represents the inverse of the non-linear characteristic of the power amplifier. Thus, a cascade transfer function of the digital pre-distorter and the power amplifier is linear.

For many RF communication systems, the requirements on instantaneous signal bandwidth (ISBW)/video bandwidth (VBW) of the power amplifier is continually increasing as requirements on system data throughput are continually increasing. Limited VBW introduces memory effects that impair the performance and/or increase required complexity of digital pre-distortion linearizers. For example, the VBW of a device may be directly affected by the low frequency resonance (LFR) caused by interaction between bias feeds and output circuits that are electrically connected between active devices and an output lead. Power amplifiers with significant memory effects thus rely on pre-distortion signals applied to the input also containing the inverse of the memory characteristics, thereby increasing the complexity and power consumption of the pre-distorter. Such complications can also limit the extent to which the system is capable of cancelling unwanted distortion products. Consequently, increasing VBW of a power amplifier reduces the complexity and power consumption of the digital pre-distorter and may also improve overall transmitter performance.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

FIG. 3b is a cross-sectional view of the device of FIG. 3a taken along line 3b-3b of FIG. 3a.

FIG. 4b is a cross-sectional view of the device of FIG. 4a taken along line 4b-4b of FIG. 4a.

DETAILED DESCRIPTION

Figure 1:
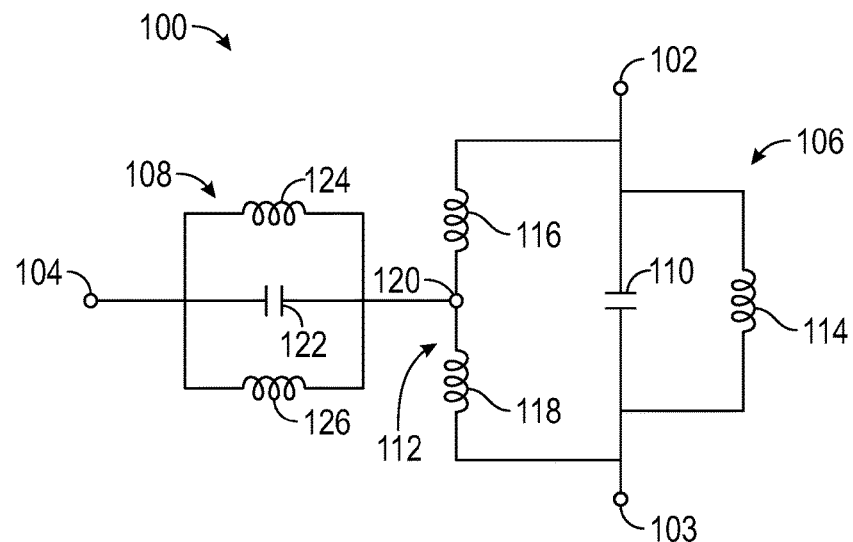
FIG. 1 is a schematic view of a two-resonator circuit that may be incorporated into a power amplifier circuit in accordance with one embodiment.

Embodiments of circuits and devices with multiple resonators for video bandwidth enhancement are described. In some embodiments, the circuits or devices include a first resonator configured to resonate at a radio frequency to isolate RF signals carried by multiple amplifier paths or stages, as well as a second resonator also configured to resonate at the radio frequency. Both resonators pass signals at a baseband frequency to a reference voltage node via a capacitor (e.g., a decoupling capacitor). The two resonators thus together act to lower the baseband impedance to the reference voltage node (e.g., ground node) of the device, while the RF isolation between the amplifier paths is maintained by the first resonator. Lowering the baseband impedance enhances, i.e., improves, the video bandwidth of the amplifier devices.

By enhancing the video bandwidth of the amplifier devices, the enhanced video bandwidth embodiments disclosed herein may reduce impairment on linearization techniques, such as digital pre-distortion linearization. The disclosed devices and methods thus alleviate the effects of a limited video bandwidth, such as the introduction of memory effects or terms. Without sufficient video bandwidth, the memory terms would be generated from the baseband (or envelope) terms. The enhanced video bandwidth of the amplifier devices thus allows the linearization schemes to support the achievement of higher signal bandwidths by the amplifier devices.

The multiple-resonator video bandwidth enhancement is useful in connection with Doherty and other amplifier configurations. The video bandwidth of an amplifier device is enhanced without adversely affecting the operation of the amplifier device. For instance, when used in conjunction with embodiments described below, the multiple paths of a Doherty power amplifier remain isolated despite the electrical connection between the paths by the first resonator. The behavior of the Doherty power amplifier is accordingly preserved.

The resonators may be connected at various points along the amplifier paths. In some cases, the resonators are connected to output networks (such as output matching networks) of the amplifier paths. Alternatively or additionally, the resonators are connected to the output conduction terminals (e.g., drain terminals) of the amplifiers. These connections may be considered to effectively introduce additional, parallel inductive paths to AC ground. Additional inductive paths to ground lower the overall inductance to ground. The inductive paths may be in addition to, for instance, the inductance of a bias feed for the amplifier devices.

Although described in connection with Doherty power amplifiers, the circuits and devices described herein are useful in connection with a wide variety of amplifier configurations. For instance, the number of paths or stages in the amplifier device may vary. The circuits and devices described herein are also not limited to a particular use scenario or application, but may be useful in base stations or other communication infrastructure equipment. The described circuits and devices may be used in a wide variety of applications and use scenarios. The disclosed circuits and devices are accordingly not limited to any particular type of load.

Video bandwidth enhancement may be provided in a compact and efficient manner by the disclosed circuits and devices. For instance, the multiple-resonator aspects of the disclosed circuits and devices may be provided via a compact structure, such as a small printed circuit board, an integrated passive device (IPD), or another packaged semiconductor device, that saves space on a printed circuit board to which the device is coupled. The multiple-resonator aspects of the disclosed devices may also be integrated in a single package with other components of the amplifier device, such as the power transistors. The extent of the integration may vary from the examples described herein.

FIG. 1 is a schematic view of a two-resonator circuit 100 that may be incorporated into a power amplifier circuit in accordance with one embodiment. The circuit 100 includes three ports 102, 103, 104 and two resonators 106, 108. The first resonator 106 is coupled between ports 102 and 103 and the second resonator 108 is coupled between port 104 and resonator 106. According to an embodiment, resonator 106 includes capacitance 110 and inductances 112, 114 coupled in parallel with each other between ports 102 and 103. Inductance 112 is a split inductance comprising first and second inductances 116, 118, with an intermediate node 120 between the inductances 116, 118. In the illustrated embodiment, the second resonator 108 is more specifically coupled between port 104 and intermediate node 120. In the example of FIG. 1, the second resonator 108 includes a capacitance 122 and inductances 124, 126 in parallel with one another and the capacitance 122. Other capacitance-inductance arrangements may be used for the resonators 106, 108.

As will be described in more detail later, circuit 100 may be coupled between two parallel amplifier paths. In a specific embodiment, for example, ports 102 and 103 may be coupled to current-conducting terminals (e.g., drain terminals) of power transistor devices (e.g., power transistors described in connection with FIGS. 5-10), and port 104 may be coupled to one or more decoupling capacitors (e.g., capacitors described in connection with FIGS. 5-9). In such an embodiment, resonator 106 may provide RF frequency isolation between ports 102 and 103. For example, when the parallel amplification paths correspond to main and peaking amplifier paths of a Doherty power amplifier, the RF frequency isolation may help to ensure correct Doherty power amplifier operation. In addition, in such an embodiment, resonator 108 may provide RF isolation between port 102 and port 104, as well as provide RF isolation between ports 103 and 104.

The configuration of the resonators 106, 108 may vary from the example shown. For example, the node 120 at which the resonators 106, 108 are connected may be relocated to the other side of either the inductor 116 or the inductor 118. In such embodiments, resonator 108 would be coupled between port 104 and port 102, or between port 104 and port 103, respectively. In these and other cases, the inductance 112 may include only a single inductor. Other configurations may additionally or alternatively be used. For instance, either one or both of the resonators may include a single inductor in parallel with a capacitor. Depending on the operating frequency, one or both of the resonators may be constructed using inductors in the range from about 50 picohenrys (pH) to about 100 nanohenrys (nH), and capacitors in the range from about 100 femtofarads (fF) to about 10 microfarads (μF), although values outside these ranges may be used.

Figure 2:
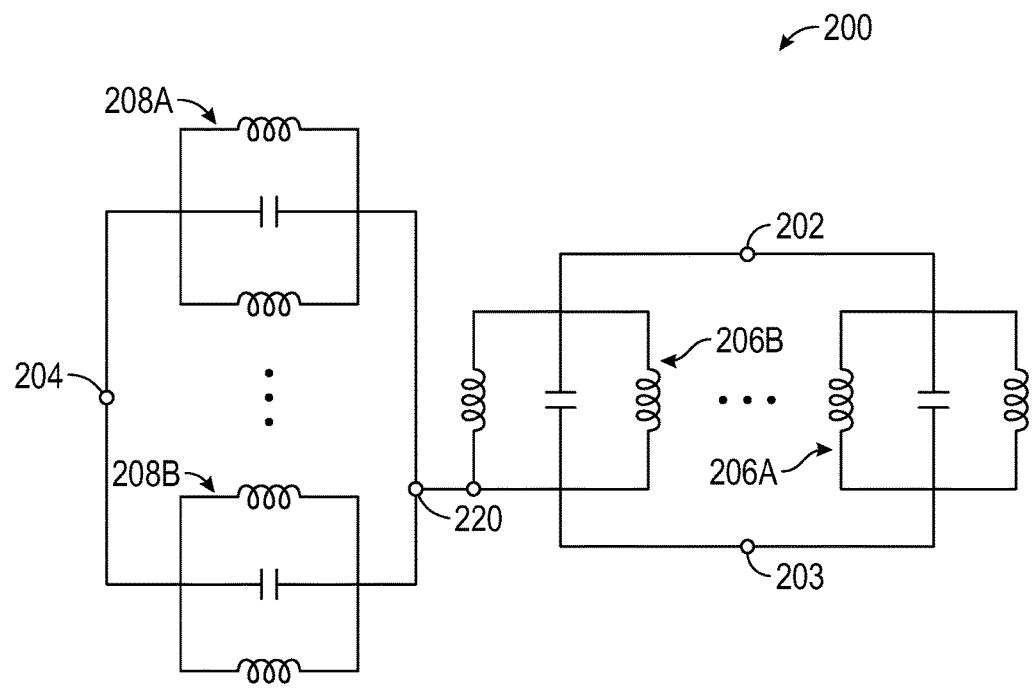
FIG. 2 is a schematic view of a multi-resonator circuit with M parallel resonators between a first two ports, and with N parallel resonators coupled to a third port.

FIG. 2 is a schematic view of a multi-resonator circuit 200 that may be incorporated into a power amplifier circuit in accordance with another embodiment. In this embodiment, the circuit 200 includes a number M of parallel resonators between ports 202 and 203 (e.g., 1⇐M⇐5) and a number N of parallel resonators connected to port 204 (e.g., 1⇐N⇐5). In the example shown, there are two parallel resonators 206A, 206B between ports 202 and 203, and two parallel resonators 208A, 208B connected to port 204. Each resonator 206A, 206B, 208A, 208B may be configured in a manner similar to the examples described above in connection with the resonators 106, 108 of FIG. 1. For instance, each resonator 206A, 206B, 208A, 208B may have a respective parallel capacitance-inductance arrangement as described above. The component values of the capacitances and inductances of the resonators 206A, 206B, 208A, 208B may differ from the above-described examples in accordance with, for instance, the numbers M, N of instances of each resonator. The component values of a respective one of the resonators 206A, 206B, 208A, 208B may or may not differ from the other resonators 206A, 206B, 208A, 208B.

In the example of FIG. 2, the resonators 206A, 206B are connected to the resonators 208A, 208B at a node 220. In this case, the node 220 is electrically tied to the port 203. The location of the node 220 may vary from the example shown. For instance, the node 220 may be electrically tied to the port 202. In still other cases, one or more of the resonators 206A, 206B includes a split inductor for connection as described above in connection with the example of FIG. 1.

Figure 3A:
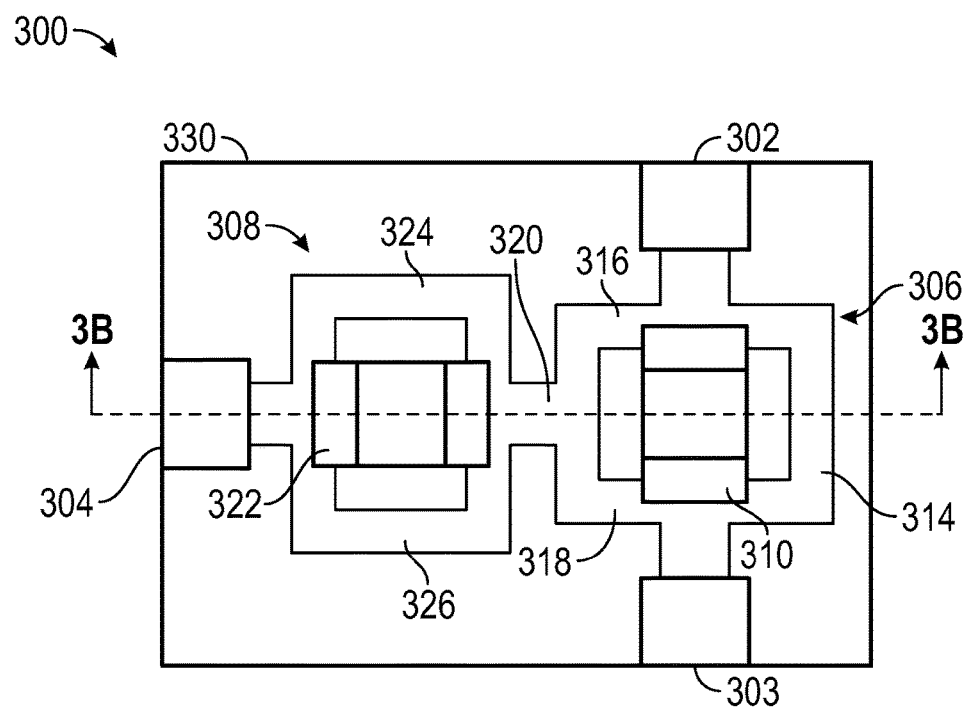
FIG. 3a is a top view of an example of a device that includes the multiple-resonator circuit of FIG. 1 in accordance with one embodiment.
Figure 3B:
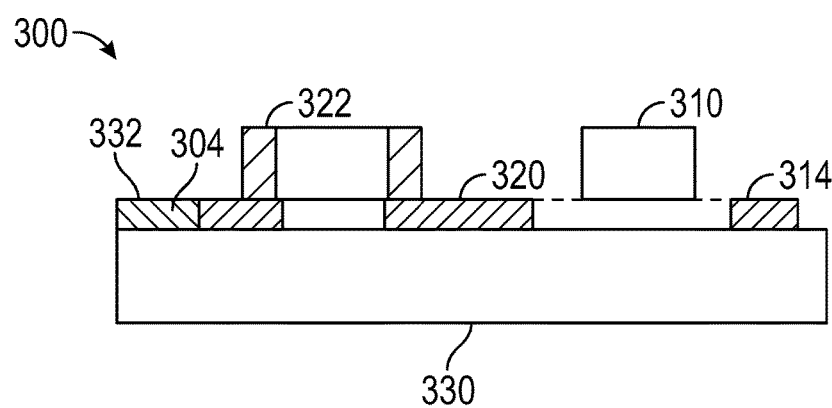

FIGS. 3a and 3b are top and side cross-sectional views of an example of a device 300 that implements the two-resonator circuit of FIG. 1 in accordance with one embodiment. The multi-resonator device of FIG. 2 may be implemented similarly. The device 300 includes ports 302-304, which correspond with ports 102-104 of FIG. 1, respectively. The device 300 includes resonators 306, 308, which correspond with the resonators 106, 108 of FIG. 1, respectively. In this case, a respective surface mount capacitors 310, 322 provide the capacitances for each resonator 306, 308, respectively. The inductances of the resonators 306, 308 are implemented by printed traces 314, 316, 318, 324, 326, each trace corresponding with a respective one of the inductances shown in FIG. 1 (e.g., inductances 114, 116, 118, 124, 126, respectively). The traces 316, 318, 324, 326 meet at a node 320 as described above in connection with the node 120 of FIG. 1.

In this case, the resonators 306, 308 may be disposed on, and implemented as, a printed circuit board (PCB) 330. One or more of the printed traces 314, 316, 318, 324, 326 may be disposed in or on any layer of the PCB 330, in cases in which the PCB 330 is a multi-layer PCB. Alternatively, one or more of the inductances and/or inductors may be implemented as surface mount devices, printed coils, wirebonds, or other inductive components.

The device 300 includes a respective pad 332 (FIG. 3b) for each port 302-304. Each pad 332 may be located at a top surface of the PCB 330, and connections to the ports 302-304 may be made to external circuitry using wirebonds. Alternatively, the device 300 may be an integrated passive device (IPD) implemented using a semiconductor substrate or a ceramic substrate, rather than a PCB. In such embodiments, the capacitors 310, 322 may be surface mount devices (as shown), or the capacitors 310, 322 may be integrated metal-insulator-metal (MIM) capacitors. Similarly, the inductors may be surface-mount inductors or integrated spiral inductors.

Figure 4A:
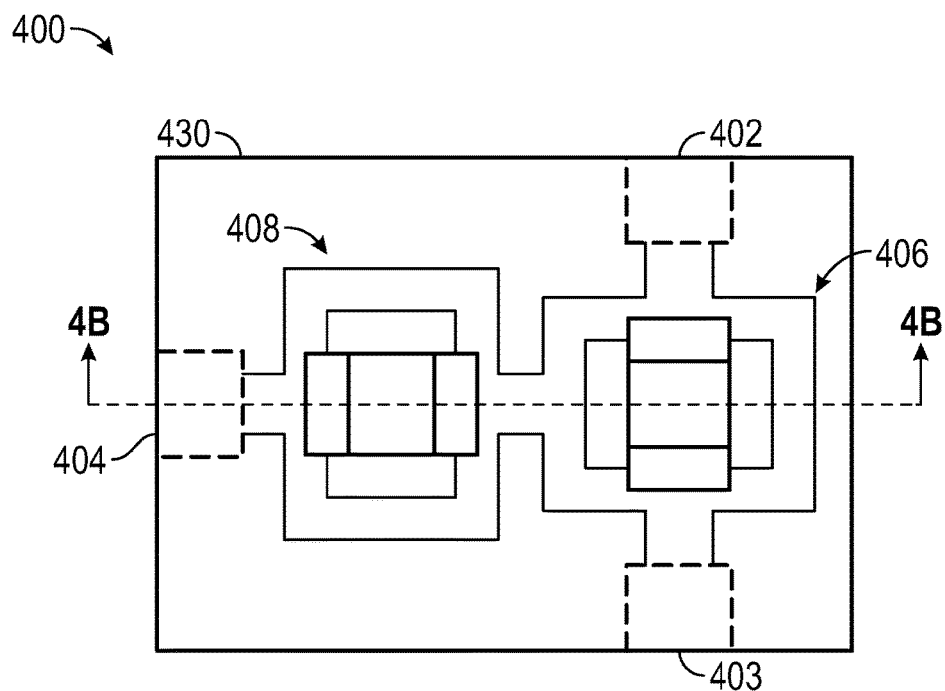
FIG. 4a is a top view of an example of a device that includes the multiple-resonator circuit of FIG. 1 in accordance with another embodiment.
Figure 4B:
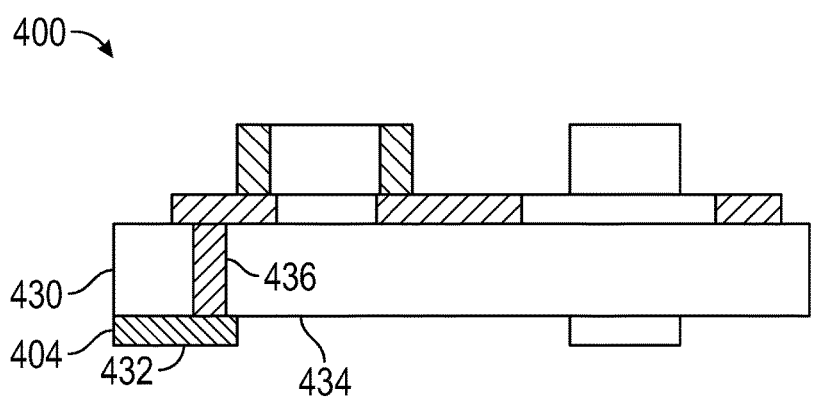

FIGS. 4a and 4b are top and side cross-sectional views of an example of a device 400 that includes the two-resonator circuit of FIG. 1 in accordance with another embodiment. The device 400 may be configured similarly to the embodiment described and shown in connection with FIGS. 3a and 3b. For instance, the device 400 may include a PCB 430 on which resonators 406, 408 are disposed. The resonators 406, 408 may be configured as described above in connection with the resonators 306, 308 of FIG. 3a.

The device 400 differs from the above-described devices in that pads for ports 402-404 are located at a bottom surface 434 (FIG. 3b) of the PCB 430. For example, a pad 432 (FIG. 4b) is provided for the port 404. Electrical connections between the pads 432 and the capacitors/inductors are established using conductive through substrate vias (TSVs) 436. Connections to the pads 432 may be made by solder connections with corresponding pads on a second PCB (e.g., a PCB that includes other components of the device, such as a splitter, combiner, and/or power transistors as described below in connection with FIG. 5).

Figure 5:
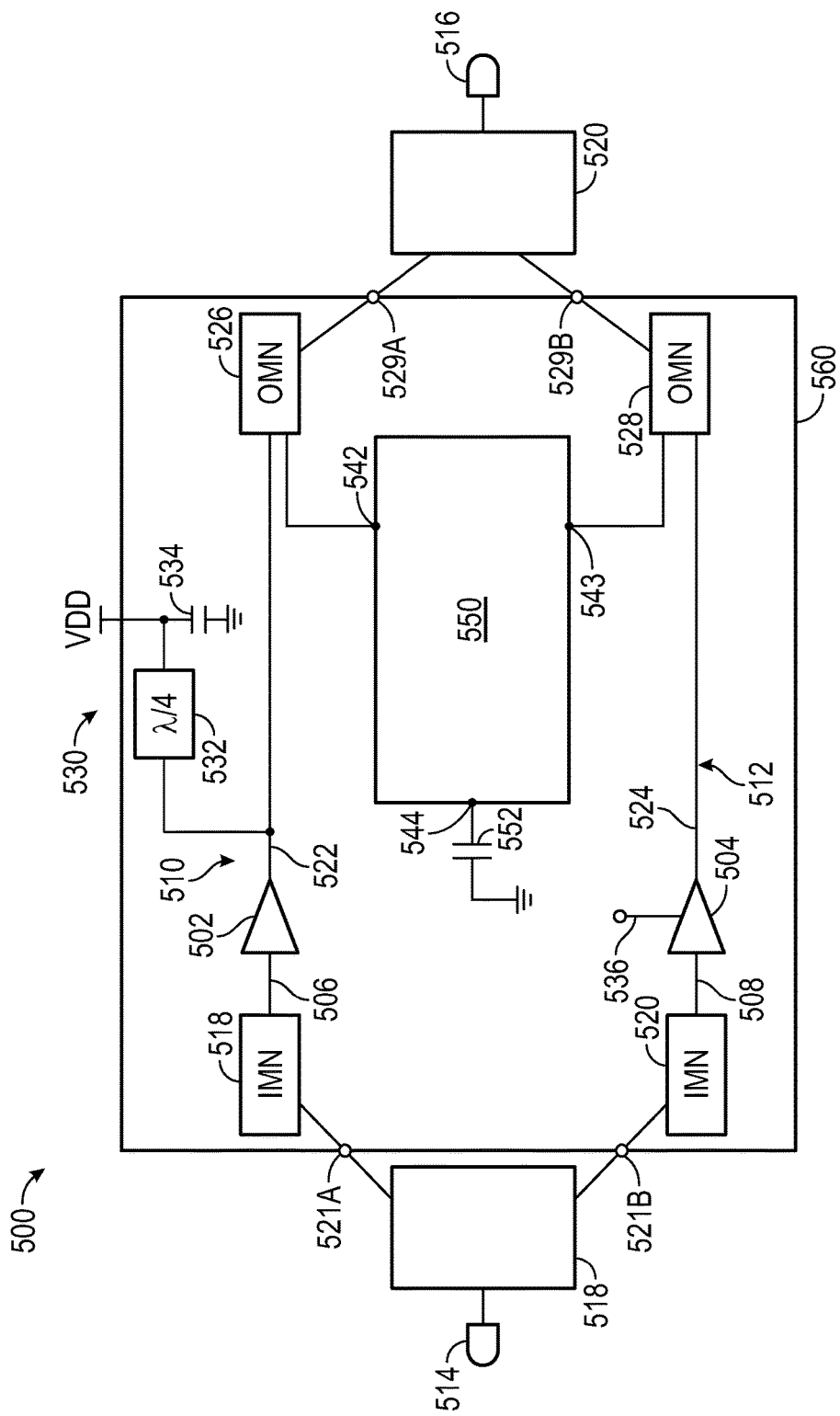
FIG. 5 is a schematic view of an example amplifier device with multiple-resonator video bandwidth enhancement in accordance with one embodiment.

FIG. 5 depicts a multi-path amplifier 500 having multiple-resonator video bandwidth enhancement in accordance with one example. In the illustrated embodiment, the multi-path amplifier 500 more specifically is configured as a two-way Doherty power amplifier with a main amplification path 510 and a peaking amplification path 512 implemented in parallel. In other embodiments, a Doherty amplifier may be an N-way Doherty amplifier that includes a main amplification path and multiple peaking amplifier paths (e.g., two, three, or more peaking amplifier paths). In still other embodiments, the multi-path amplifier may be an amplifier other than a Doherty power amplifier, in which case the below-described splitter 518 and combiner 520 may be excluded.

In the illustrated Doherty configuration, the multi-path amplifier 500 includes a pair of amplifiers 502, 504 that are configured and interconnected between input node 514 and output node 516 in a two-path amplifier arrangement. A first RF input signal received at input node 514 is divided by a splitter 518 into second and third RF signals to be amplified along amplifier paths 510, 512, respectively. In an embodiment, the splitter 518 is configured to impart a 90 degree phase difference between the second and third RF signals. For example, in a "non-inverted" Doherty amplifier configuration, the splitter 518 may produce the second and third RF signals so that the third RF signal provided to path 512 lags the second RF signal provided to path 510 by 90 degrees. Conversely, in an "inverted" Doherty amplifier configuration, the splitter 518 may produce the second and third RF signals so that the second RF signal provided to path 510 lags the third RF signal provided to path 512 by 90 degrees.

Each amplification path 510, 512 may include an input matching network (IMN) 518, 520, a single-stage or multi-stage power amplifier 502, 504, and an output matching network (OMN) 526, 528 disposed in series between the splitter 518 and a combiner 520. As mentioned above, amplifier 500 is configured in a Doherty amplifier arrangement. In such a configuration, the amplifier 502 may be biased to operate in a class AB mode, and thus act as a main or carrier amplifier. Conversely, the amplifier 504 may be biased to operate in a class C mode, and thus act as a peaking amplifier. The input and output matching networks 518, 520, 526, 528 may then be configured to adjust the phases of the RF signals carried via the amplifier paths 510, 512 in accordance with various two-way Doherty architectures.

Each amplifier 502, 504 may include one or more RF power transistor devices, such as power field effect transistor (FET) devices or bipolar junction transistor (BJT) devices. More specifically, for example, each power amplifier 502, 504 may be implemented as a laterally-diffused metal oxide semiconductor (LDMOS) amplifier, a high-electron-mobility transistor (HEMT), or another type of transistor using silicon, gallium nitride (GaN), gallium arsenide (GaAs) or other semiconductor substrates, in various embodiments. Using nomenclature common to FET devices (but not intending to limit the scope to implementations that use only FET devices), each power amplifier 502, 504 includes a control terminal (e.g., a gate) and two current-conducting terminals (e.g., drain and source terminals). Each power amplifier 502, 504 may be a single stage amplifier or a multi-stage amplifier. The amplifiers 502, 504 are configured to amplify an RF input signal(s) received at or via the input terminals 506, 508, respectively.

As mentioned above, the multi-path amplifier 500 may include input and output networks disposed along the amplifier paths 510, 512. In the example of FIG. 1, the input network includes input matching networks 518, 520 for the amplifier paths 510, 512, respectively. The input matching networks 518, 520 may be configured to implement impedance matching on the input side of the amplifiers 502, 504. The input matching networks 518, 520 receive the second and third RF signals via ports or other nodes 521A, 521B of the device 500.

The input matching networks 518, 520 and/or other input networks of the multi-path amplifier 500 may be integrated to any desired extent. For example, a number of elements of the input matching networks 518, 520 may be disposed on a common integrated circuit (IC) chip or within a packaged semiconductor device. The manner in which the RF input signal(s) are distributed to the amplifiers 502, 504 may thus vary from the example shown.

The amplifiers 502, 504 are configured to generate respective RF signals on the amplifier paths 510, 512 in response to the RF input signals. In the example of FIG. 5, the respective RF signals are provided at nodes 522, 524 along the amplifier paths 510, 512, respectively. The nodes 522, 524 may correspond with the output conduction terminals of the power transistors of the amplifiers 502, 504. For example, the nodes 522, 524 may correspond with the respective drain terminals of FET transistor devices or the respective collector terminals of BJT transistor devices.

The multi-path amplifier 500 includes one or more output networks that process the RF signals generated by the amplifiers 502, 504. In the example of FIG. 5, the multi-path amplifier 500 includes an output matching network 526 disposed along the amplifier path 510, and an output matching network 528 disposed along the amplifier path 512. The output matching networks 526, 528 may be configured for impedance matching with one or more loads coupled to the output terminal 516. The output matching networks 526, 528 may provide other functions, including, for instance, phase adjustments. In this case, the output matching networks 526, 528 provide output signals at ports or other nodes 529A, 529B of the device 500.

The output network(s) of the multi-path amplifier 500 may include additional network elements. For instance, the multi-path amplifier 500 may include a combiner 520 directed to combining the RF signals along the amplifier paths 510, 512. In some cases, the combiner 520 combines the amplified signals in phase. The combiner 520 and/or the splitter 518 may include one or more elements directed to providing a phase shift and/or impedance inversion. In other cases, multiple output signals may be provided. The combiner 520 and/or other elements may be integrated with the output matching networks 526, 528 to any desired extent. More specifically, after amplification of the second and third RF signals by amplifiers 502, 504, the amplified second and third RF signals are combined by combiner 520, thus producing an amplified output signal at output node 516. Prior to combining the amplified second and third RF signals, the combiner 520 may adjust the phase of one or both signals to ensure that the signals are combined in phase. For example, in a "non-inverted" Doherty amplifier configuration, the combiner 520 may add a 90 degree phase delay to the second RF signal prior to combining the second and third RF signals. Conversely, in an "inverted" Doherty amplifier configuration, combiner 520 may add a 90 degree phase delay to the third RF signal prior to combining the second and third RF signals.

The inputs and/or outputs of amplifiers 502, 504 may be biased via one or more bias feeds. In the example of FIG. 5, the bias feed(s) is/are coupled to the output nodes 522, 524 of the amplifier paths 510, 512. More specifically, the amplifier 502 uses a bias feed circuit 530 to provide a bias voltage, VDD, to the output conduction terminal of amplifier 502. The bias feed circuit 530 includes a quarter-wave element 532 or other impedance inversion element. The quarter-wave element 532 or other impedance inversion element establishes an inductive coupling to a reference voltage node. In the example of FIG. 5, the reference voltage node corresponds with ground (or a ground node). The bias feed circuit 530 includes a shunt capacitor 534 to shunt any AC components of the bias voltage VDD to the reference voltage node and thus away from the amplifier path 510.

The amplifier 504 may use a common bias feed, a similar bias feed, or a different bias feed. In some cases, one or more elements of the bias feed circuit 530 may be shared or relied upon by both of the amplifiers 502, 504. For instance, the amplifier 504 may rely on the same shunt capacitor 534. The amplifier 504 is shown in FIG. 5 with a bias feed 536 depicted schematically for ease in illustration. In one example, the schematic depiction of the bias feed 536 is representative of a bias feed in common with the bias feed circuit 530. In that case, the elements of the bias feed circuit 530 are connected to, and relied upon by, both of the amplifier paths 510, 512.

The multi-path amplifier 500 includes a multiple-resonator circuit or device 550 to reduce the baseband impedance to ground for the amplifier paths 510, 512. The lower baseband impedance reduces the generation of memory terms on the amplifier paths 510, 512, thereby improving the effectiveness of digital pre-distortion linearization efforts and, ultimately, the linearity of the multi-path amplifier 500. The multiple-resonator circuit 550 may be configured in accordance with one of the examples described above in connection with FIGS. 1-4. The circuit 550 is coupled to and along the amplifier paths 510, 512 via three ports 542-544, which may correspond with the three ports in the examples described above. For example, referring also to FIGS. 1-4, port 542 may correspond with any of ports 102, 202, 302, 402, port 543 may correspond with any of ports 103, 203, 303, 403, and port 544 may correspond with any of ports 104, 204, 304, 404. In one example, the multiple-resonator circuit 550 includes two resonators. As described above, one of the resonators couples the ports 542 and 543, and another resonator couples the first resonator and the third port 544.

The ports 542, 543 are coupled to the output nodes 522, 524 (e.g., transistor drain terminals) of the amplifier paths 510, 512. In the example of FIG. 5, the ports 542, 543 are coupled to the output nodes 522, 524 via the output matching networks 526, 528. In this case, the ports 542, 543 are electrically tied to respective nodes within the output matching networks 526, 528. The location or other characteristics of the nodes may vary. For instance, the ports 542, 543 may be electrically tied to other nodes, e.g., not within the output matching networks 526, 528, as described in connection with a number of examples below. For instance, the ports 542, 543 may be connected to other current-conducting terminals, such as the drain terminals of the transistor devices in the amplifiers 502, 504. The connection may be direct (no intermediary elements—e.g., electrically tied) or indirect (one or more intermediary elements).

The resonator(s) of the circuit 550 disposed between the ports 542, 543 (e.g., resonator 106 of FIG. 1 or 206A-206B of FIG. 2) is/are configured to resonate at the frequency of the RF signals amplified by the multi-path amplifier 500, thereby providing isolation between nodes 542 and 543 at radio frequency, while allowing signals at baseband frequency to pass. The resonators thus provide lower isolation at baseband frequency, thereby reducing baseband impedance. Resonance at the frequency of the RF signals may include a frequency response having a resonant frequency at or substantially near the frequency of the RF signals. The resonator may thus have a resonant frequency that is offset from the frequency of the RF signals. For instance, resonance at the radio frequency may thus include a resonant frequency offset from the frequency of the RF signal, but nonetheless sufficient to provide a useful amount of isolation at the frequency of the RF signals, as well as a sufficiently low amount of isolation at the baseband frequency.

In some cases, baseband frequencies fall in a range from about 0 to about 1 MHz. In other cases, baseband frequencies fall in a range from about 0 to about 20 GHz. For example, current cellular telecommunications amplifiers may have required baseband frequency ranges (ISBW) from about 0 to about 40 MHz, or from about 0 to about 900 MHz with RF operating frequencies ranging from about 600 MHz to about 6 GHz. The higher the maximum baseband frequency (or ISBW) to RF operating frequency, the greater is the need to improve baseband impedance (improve VBW). Other baseband frequencies or frequency ranges may be used.

As discussed above, the resonator(s) of the circuit 550 disposed between the ports 542, 543 is configured to provide RF isolation between the ports 542, 543 in the RF frequency band in which the amplifier is operating. The resonator may thus be used to isolate the RF signals on the amplifier paths 510, 512 from one another. Such RF isolation may be useful in Doherty and other amplifier architectures in which the amplifier paths 510, 512 are isolated from one another before a combiner or other output network. The RF frequencies blocked or otherwise sufficiently attenuated by the resonator may fall in a range from about 40 MHz to about 6 GHz, but other RF frequencies or frequency ranges may be used. For instance, the radio frequency may be higher than 6 GHz. The frequency response of the resonator may thus block such RF signals while establishing a path between the ports 542 and 543 for DC and low frequency (e.g., baseband) signals.

The other resonator(s) of the circuit 550 connected to the port 544 (e.g., resonator 108 of FIG. 1 or 208A-208B of FIG. 2) are similarly configured to block (isolate) signals at the radio frequency and to pass signals at the baseband frequency to the port 544. The resonator may pass the baseband frequency signals passed by the resonator(s) disposed between the ports 542, 543. For instance, using the example of FIG. 1 as the circuit 550, the resonator 106 is coupled to the port 103 and thus, passes the baseband frequency signals present at that node to the port 104. To that end, the resonator 108 may be configured to pass the same (or at least some of the same) baseband frequencies passed by the resonator 106. In some cases, the resonator 106 and the resonator 108 have a similar or identical frequency response. In other cases, the frequency responses of the resonators 106, 108 differ. For example, the resonator 106 may be configured to block a broader or narrower range of RF frequencies than the resonator 108. Additional or alternative differences in the frequency responses may be provided.

The multiple-resonator structure 550 may or may not be considered to include a capacitor 552 that couples the port 544 to a reference voltage node, such as a ground node. The capacitor 552 accordingly establishes a path to ground for the baseband frequency signals resonated or passed by the resonator(s) connected to the port 544. The baseband frequency signals present along the amplifier paths 510, 512 may thus be shunted or passed to ground. The capacitor 552 may accordingly be considered and configured as a decoupling capacitor. The capacitor 552 may have a capacitance falling in a range from about 1 nanofarad to about 1 millifarad, although other capacitance levels may be used.

The resonator connected to the port 544 may also be configured to provide RF isolation between the ports 543 and 544. The RF isolation may be similar or identical to the RF isolation provided by the resonator disposed between the ports 542, 543. For instance, in the example of FIG. 5, the RF isolation blocks RF signals on the amplifier path 512 from being shunted to ground via the capacitor 552, and likewise for the other amplifier path 510.

Each resonator in the circuit 550 may include one or more capacitors and one or more inductors connected in a parallel circuit as described above. Each capacitor and inductor may be or include one or more discrete or distributed components. For example, the components may introduce capacitance or inductance in distributed fashion via, for instance, transmission lines, but nonetheless be modeled as lumped elements. The capacitors and inductors may thus be packaged or otherwise configured in various forms, examples of which are described below. Alternatively or additionally, the resonator(s) may use parasitic capacitances or inductances.

A number of the components of the device 500 may be disposed in a common package or on a common substrate (e.g., a PCB). In this example, all of the components within the box labeled 560 may be disposed in a package. For example, the box 560 enclosing the input matching networks 518, 520, amplifiers 502, 504, output matching networks 526, 528, and circuitry 550 may represent a device package within which these components are contained (e.g., as exemplified by device 1000, FIG. 10). Nodes 521A, 521B, 529A, 529B may correspond to input and output leads for the device (e.g., leads 1016, 1030, 1018, 1032, FIG. 10). Further details regarding such packaged devices or components are provided below.

Figure 6:
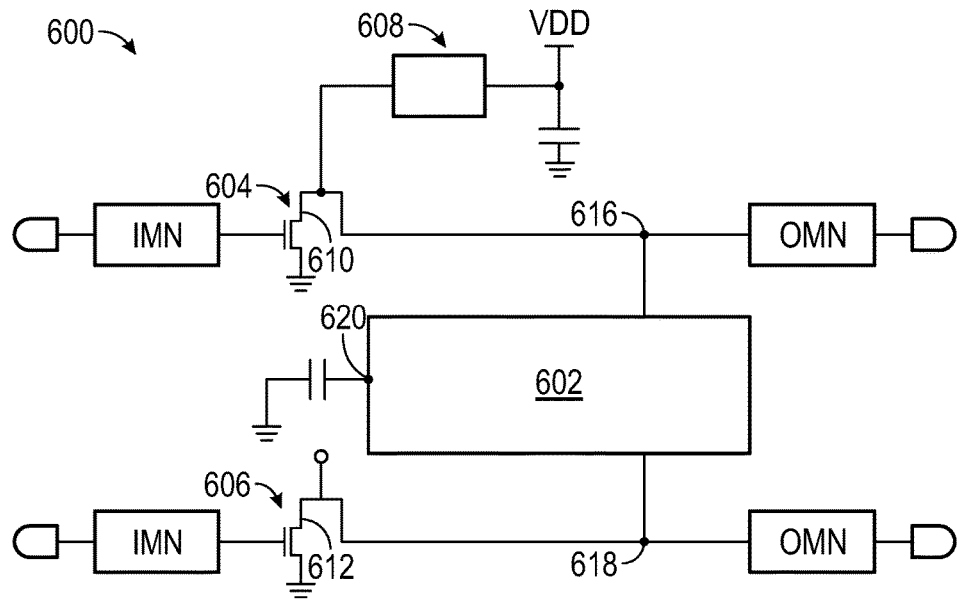
FIG. 6 is a schematic view of another example amplifier device with multiple-resonator video bandwidth enhancement in accordance with one embodiment.

FIG. 6 depicts another device 600 having a multiple-resonator structure 602 for video bandwidth enhancement. The device 600 provides another example of the manner in which the multiple-resonator structure 602 lowers the equivalent drain baseband impedance to ground, while providing RF isolation of the amplifier paths. The device 600 may be configured similarly in several respects to the multi-path amplifier 500 of FIG. 5. For instance, the device 600 may include amplifier paths having respective input and output networks. In the example of FIG. 6, the amplifier paths are shown in greater detail to depict amplifiers as power FET transistors 604, 606. The multiple-resonator structure 602 may also be configured as described above in connection with the examples shown in FIGS. 1-4. For example, referring also to FIGS. 1-4, node 616 may correspond with any of ports 102, 202, 302, 402, node 618 may correspond with any of ports 103, 203, 303, 403, and port 620 may correspond with any of ports 104, 204, 304, 404.

The device 600 may include one or more bias feed circuits 608 connected to drain terminals 610, 612 of the FET transistors 604, 606, respectively. An example of the bias feed circuit 608 is shown in connection with one transistor 604, while the bias feed for the other transistor 606 is depicted schematically for ease in illustration. The transistors 604, 606 may share the bias feed circuit 608. For example, the drain terminals 610, 612 of the transistors 604, 606 may both be connected to the same bias feed circuit 608.

The parallel connection of the drain terminals is supported by the multiple-resonator structure 602. The multiple-resonator structure 602 may be configured in accordance with any of the examples described above.

In the example illustrated in FIG. 6, a resonator of the structure 602 is connected to nodes 616, 618, which are electrically tied to the drain terminals 610, 612. The ports of the multiple-resonator structure 602 are therefore upstream of the output matching networks (i.e., earlier along the amplification path), as shown. The multiple-resonator structure 602 thus facilitates and establishes a direct DC connection between the drain terminals 610, 612. The multiple-resonator structure 602 may accordingly allow a single bias feed to be used for the DC power supply VDD.

Regardless of whether a single bias feed is used, the parallel connection of the drain terminals lowers the baseband impedance to ground, e.g., over an increased bandwidth. For instance, the multiple-resonator structure 602 (and other multiple-resonator structures described herein) establishes a short electrical length between a third port 620 of the resonator structure 602 and the drain terminals 610, 612.

Other types of output conduction terminals may be electrically tied to the resonator of the multiple-resonator structure 602. For instance, in other examples, the drain terminals 610, 612 are collector terminals of power BJT devices. The configuration of the output conduction terminals and other characteristics of the amplifiers 604, 606 may vary accordingly.

Figure 7:
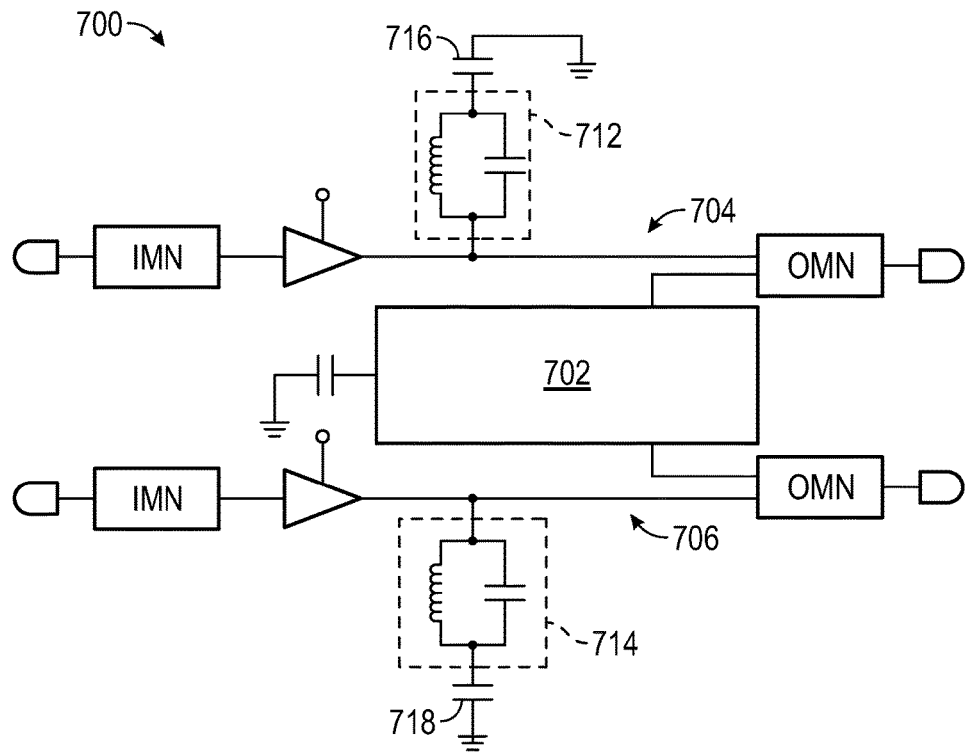
FIG. 7 is a schematic view of yet another example amplifier device with multiple-resonator video bandwidth enhancement in accordance with one embodiment.

FIG. 7 depicts another device 700 having a multiple-resonator structure 702 for video bandwidth enhancement. The device 700 provides another example of the manner in which the multiple-resonator structure 702 lowers the equivalent drain baseband impedance to ground, while providing RF isolation of amplifier paths 704, 706. The device 700 may be configured similarly in several respects to the multi-path amplifier 500 of FIG. 5 and the device 600 of FIG. 6. For instance, the device 700 may include amplifiers, bias feed networks, and input and output networks configured as described above. The multiple-resonator structure 702 may include a number of resonators arranged and configured in accordance with any of the examples described above. In this case, resonators of the multiple-resonator structure 702 are coupled to the amplifier paths 704, 706, respectively, via the output matching networks disposed along the amplifier paths 704, 706.

The device 700 differs from the above-described examples in that additional paths to ground are provided by additional resonators. In this case, each amplifier path 704, 706 has an additional, respective resonator 712, 714 coupling the amplifier paths 704, 706 to a reference voltage node, such as a ground node. The resonators 712, 714 may thus provide additional, parallel paths to ground for signals resonated by, or passing through, the resonators 712, 714. In other cases, the additional resonators may be provided as part of the multiple-resonator structure 702.

The additional, parallel paths provided by the resonators 712, 714 effectively lower the baseband impedance to ground. Each resonator 712, 714 provides a parallel inductance to the baseband impedance to ground. Each additional resonator accordingly lowers the impedance at the baseband frequency. This parallel inductor approach to lowering the baseband impedance may effectively shift any undesirably high impedance levels to higher frequencies. The higher frequencies may be sufficiently outside the frequency ranges that may lead to memory or other adverse effects.

The additional resonators 712, 714 are coupled to the reference voltage node (e.g., ground) by respective capacitors 716, 718. The capacitors 716, 718 shunt the baseband frequency signals passed by the resonators 712, 714 to the reference voltage node. The capacitors 716, 718 may be configured as decoupling capacitors suitable for shunting the baseband frequencies to ground, as described herein.

Each resonator 712, 714 may be configured similarly to the examples described above. For instance, the resonators 712, 714 may have the same or similar resonant frequency as the above-described examples, including the resonators of the multiple-resonator structure 702. In some cases, the frequency response of the resonators 712, 714 may differ from the resonators in the multiple-resonator structure 702 to address different frequency ranges. In that way, specific frequency ranges may be more directly targeted by the multiple-resonator structure 702. For instance, two or more non-contiguous, narrow baseband frequency ranges of interest may be targeted separately, rather than simply shunting a single, broad frequency range that encompasses all of the narrow sub-ranges.

As shown by the example of FIG. 7, any number of resonators may be used. The total number of resonators may be selected in view of preferences for isolation, e.g., for a specific application. Alternatively or additionally, the number of resonators may be determined or driven by an interest in various, specific filter characteristics.

One or both of the resonator 712 and/or the resonator 714 may instead be coupled to the power supply reference Voltage VDD. DC blocking capacitor 716 and/or DC blocking capacitor 718 may thus be optional. In this instance, decoupling capacitors connected to ground reference (e.g., as shown in connection with the bias feed circuit 608 of FIG. 6) may be included to ensure a low impedance termination at the power supply node. This configuration may also allow the bias voltage to be supplied to the entire device 700 with no need for additional bias voltage supply terminals, although these may be included.

Figure 8:
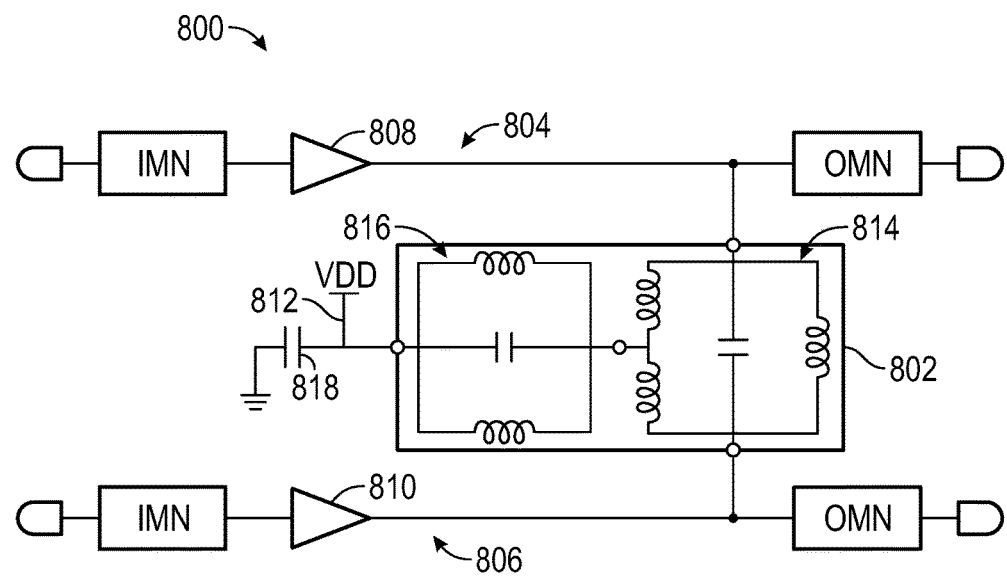
FIG. 8 is a schematic view of an example amplifier device with multiple-resonator video bandwidth enhancement and a single bias feed in accordance with one embodiment.

FIG. 8 depicts another device 800 having a multiple-resonator structure 802 for video bandwidth enhancement. The device 800 provides another example of the manner in which the multiple-resonator structure 802 lowers the equivalent drain baseband impedance to ground, while providing RF isolation of amplifier paths 804, 806. The device 800 may be configured similarly in several respects to the above-described devices. In this case, the multiple-resonator structure 802 includes two resonators arranged as described in connection with the example of FIG. 1. In other cases, the multiple-resonator structure 802 has additional resonators as set forth above in connection with the other described examples. Also as described above, the multiple-resonator structure 802 may be directly connected to conduction terminals along the amplifier paths 804, 806. Alternatively, the multiple resonator structure 802 may be connected to nodes within the output matching networks (OMN). Still other aspects of the amplifier paths 804, 806 may be configured as described above. For instance, amplifiers 808, 810 of the device 800 may be similar to those described above.

The device 800 differs from the above-described examples in connection with the bias feed networks for the amplifiers 808, 810. In this case, the bias voltage is provided to the amplifiers 808, 810 via the resonator structure 802. A single bias feed may thus be used for both (e.g., all) of the amplifiers 808, 810. As shown in FIG. 8, the resonator structure 802 includes a bias feed node 812. Separate or additional bias feeds for the amplifiers 808, 810 are accordingly not provided.

The bias feed node 812 may be connected at various nodes within or of the resonator structure 802. The resonator structure 802 includes resonators 814, 816 as described above. In the example shown, the bias feed node 812 corresponds with the port at which the resonator 816 is connected to a capacitor 818. Alternatively, the bias feed node 812 may be coupled to the node at which resonators 814, 816 of the resonator structure 802 are connected to one another. In such cases, isolation at radio frequency is provided between the resonator structure 802 and the VDD bias. For instance, a quarter-wave element may connect the bias feed node to the resonator structure 802. A decoupling capacitor may then be attached as shown in the examples FIGS. 5 and 6.

As described above, the bias feed node 812 may be connected to the amplifier paths 804, 806 via the resonator 814. Going in the other direction, the resonator 816 and a capacitor 818 of the resonator structure 802 are connected in series between the bias feed node 812 and a reference voltage node as shown.

The bias feed arrangements may vary from the examples described above in connection with FIG. 8. For instance, the bias feed node 812 may instead be electrically tied to the conduction terminal of the amplifier 808. In still other cases, bias feeds may be provided for each amplifier 808, 810. In such cases, both bias feeds may still be coupled to the reference voltage node (e.g., ground) via the resonator 816 and the capacitor 818.

The above-described devices may be realized in various types of implementations. In some cases, the devices may be implemented on a printed circuit board (PCB). The above-described devices allow multiple DC and low frequency paths to be paralleled via a resonator structure that conserves space on the PCB. For instance, PCB space may be conserved by implementing the multiple-resonator structure as an integrated passive device (IPD), examples of which were described in connection with FIGS. 3 and 4, and further examples of which are described below. The above-described devices are also not limited to PCB-based implementations as described below. For instance, the above-described devices may alternatively be implemented as a discrete, packaged semiconductor device. Alternatively, the discrete, packaged device may be an IPD or other multi-port component encompassing solely the resonator structures described above. Examples of these implementations are described below in connection with FIGS. 9 and 10.

Figure 9:
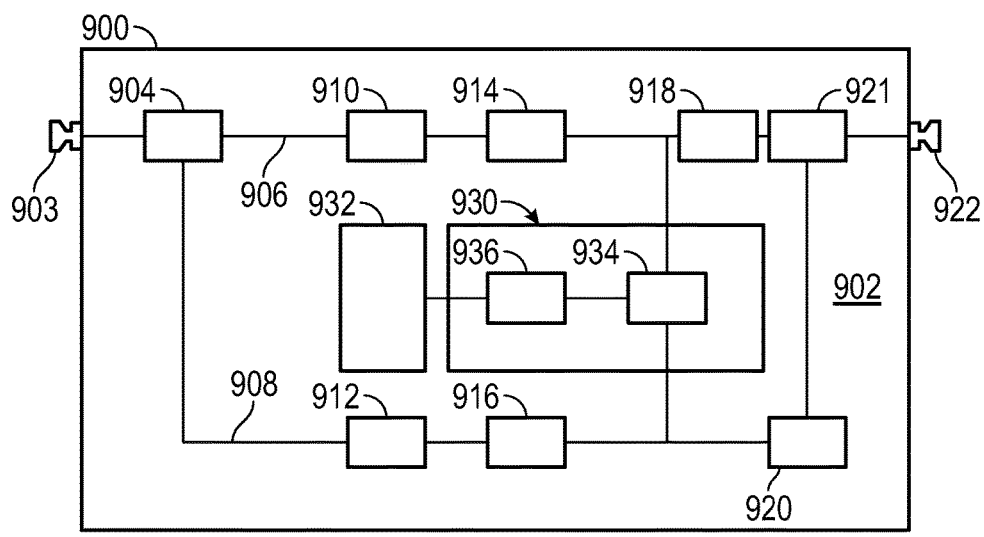
FIG. 9 is a plan view of an example printed circuit board (PCB) amplifier device with microstrip inductor-based resonators in accordance with one embodiment.

FIG. 9 depicts an amplifier device 900 implemented on a PCB 902. The amplifier device 900 may be configured as a Doherty amplifier or as another type of multi-path amplifier. Input signals are received at a terminal 903 and provided to an input splitter 904. The input splitter 904 provides RF signals on two amplifier paths 906, 908 to respective input networks 910, 912. Each input network 910, 912 is configured to provide impedance matching. One or both of the input networks 910, 912 may also apply input phasing adjustments to the input signals in accordance with, for instance, the Doherty amplifier architecture. In this example, the input splitter 904 and the impedance matching networks 910, 912 are provided as separate circuits, each with a plurality of components. One or more of these components may be realized via constituent surface-mount elements, printed traces, and so on, in various embodiments. The input signals are then provided to power transistor devices 914, 916 disposed along the amplifier paths 906, 908, respectively. The power transistor devices 914, 916 may be implemented as separate, discrete IC chips, or they may be implemented on the same chip, in various embodiments.

The one or more bias feeds for the power transistor devices 914, 916 are not shown for ease in illustration. The bias feed(s) may be configured in accordance with one of the above-described examples.

The output conduction terminals of the power transistor devices 914, 916 are connected to respective output networks 918, 920. One or both of the output networks 918, 920 may be directed to implementing impedance matching and/or output phasing adjustments. The output networks 918, 920 may be realized on separate IPDs. In this Doherty amplifier example, outputs of the output networks 918, 920 are combined at a combiner 921 that develops an output signal at an output terminal 922.

The amplifier device 900 includes a multiple-resonator structure 930 and a decoupling capacitor 932 for video bandwidth enhancement. The decoupling capacitor 932 may be implemented via a separate surface-mount component, or it may be implemented on the same substrate as the multiple-resonator structure 930. The resonator structure 930 may be implemented directly on the PCB 902 or implemented as a surface mount device, such as described in connection with the examples of FIGS. 3 and 4. The resonator structure 930 includes a first resonator 934 (e.g., resonator 106, FIG. 1) that couples the amplifier paths 906, 908. The resonator 934 is connected to a second resonator 936 (e.g., resonator 108, FIG. 1) that leads to the decoupling capacitor 932.

Microstrip traces may form the inductors of the resonator structure 930. The traces may have frequency characteristics that present benefits as well as detriments. For instance, the resonator structure 930 may exhibit a narrower frequency response, which may result in greater improvements in video bandwidth, but at the expense of reduced RF performance. The resonator structure 930 may also provide less isolation between the amplifier paths 906, 908 (e.g., the power transistor devices 914, 916), and/or between the amplifier paths 906, 908 and ground. Less isolation may lead to increased impedance dispersion under Doherty operation and reduced RF performance. Trade-offs between RF performance degradation and video bandwidth improvement may be considered.

Use of one or more surface-mount inductors in place of the microstrip traces may allow the resonator structure to achieve a wider frequency response. The greater width of the resonance characteristic may provide higher isolation between, for instance, the power transistor devices. The improvement in isolation, however, may be provided at the expense of less improvement in video bandwidth, but less degradation in RF performance. The use of surface-mount inductors may also support greater impedance matching.

Other types of inductors may be used. For example, the resonator structure may include stripline or lumped chip inductors.

High dielectric constant materials may be used in the surface-mount components. Such materials may facilitate the realization of compact components.

Further improvements in video bandwidth may be attained by connecting the resonators at or close to the power transistor device plane, and/or by placing the additional low frequency coupling closer to the power devices. Placing additional low frequency decoupling closer to the device reduces the amount of inductance from the device to the low frequency decoupling capacitor, which reduces the overall baseband impedance and improves the video bandwidth performance.

Figure 10:
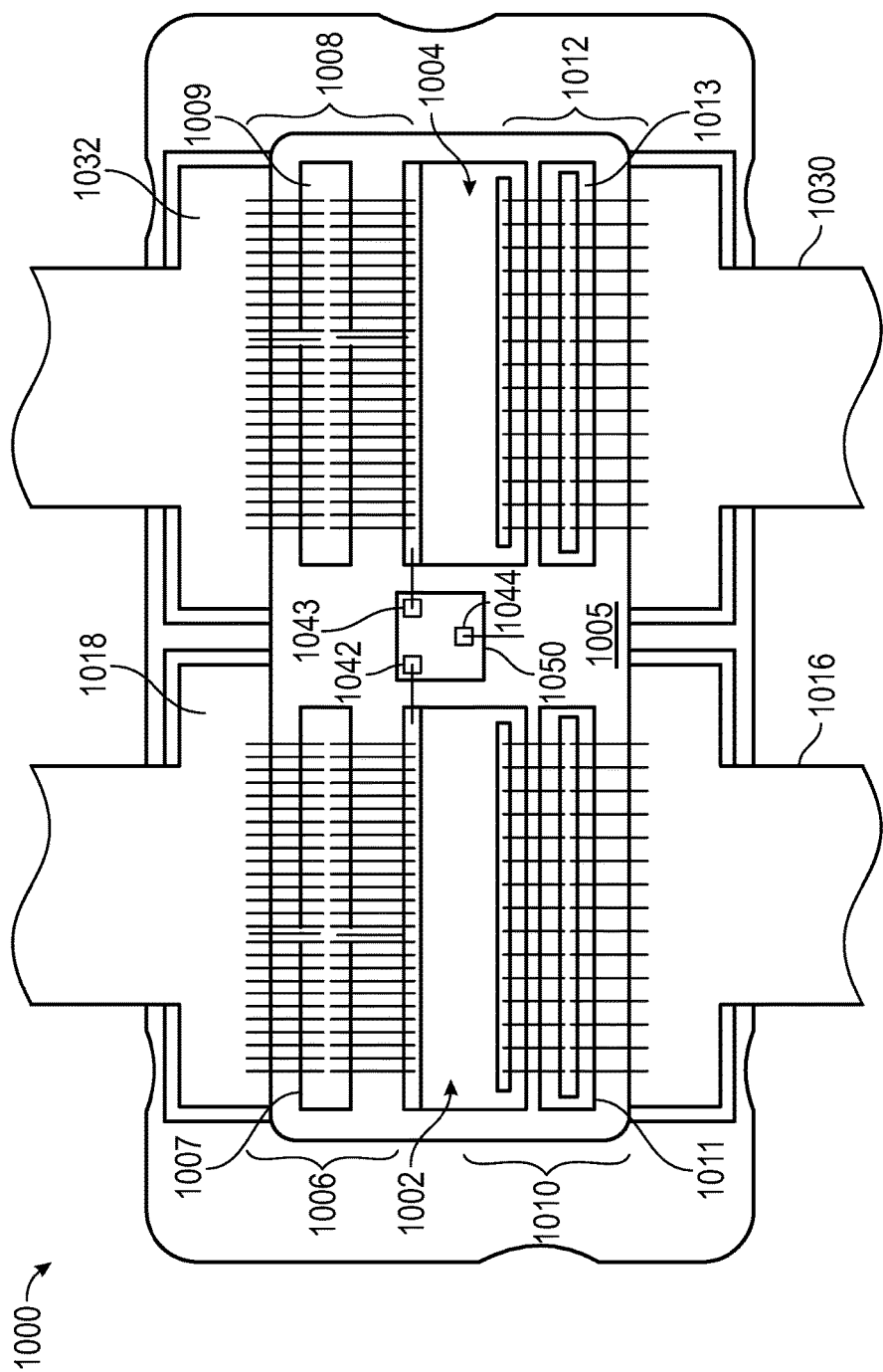
FIG. 10 is a plan view of an integrated, packaged amplifier device with multiple-resonator video bandwidth enhancement in accordance with one embodiment.

FIG. 10 is a top view of a packaged power transistor device 1000 suitable for use in a multi-path amplifier system, in accordance with one embodiment of the invention. The below description discusses incorporation of device 1000 into a Doherty amplifier system, such as that illustrated in FIG. 5, to provide a concrete example. Those of skill in the art would understand, based on the description herein, that the device 1000 could be incorporated into other multi-path amplifier systems, as well (e.g., the systems of FIGS. 6-8 or other systems).

As described above in conjunction with FIG. 5, an embodiment of a circuit within which the inventive subject matter may be incorporated includes a main amplifier 1002 (e.g., main amplifier 502, FIG. 5), a peaking amplifier 1004 (e.g., peaking amplifier 504, FIG. 5), an embodiment of a multiple-resonator circuit 1050 or device (e.g., circuits or devices 100, 200, 300, 400, 550, FIGS. 1-5), main amplifier output impedance matching network (OMN) circuitry 1006 (e.g., circuitry 526, FIG. 5) coupled between the main amplifier 1002 and its associated output package lead 1018 (e.g., node 529A, FIG. 5), peaking amplifier OMN circuitry 1008 (e.g., circuitry 528, FIG. 5) coupled between the peaking amplifier 1004 and its associated output package lead 1032 (e.g., node 529B, FIG. 5), main amplifier input impedance matching network (IMN) circuitry 1010 (e.g., circuitry 518, FIG. 5) coupled between the main amplifier 1002 and its associated input package lead 1016 (e.g., node 521A, FIG. 5), and peaking amplifier IMN circuitry 1012 (e.g., circuitry 520, FIG. 5) coupled between the peaking amplifier 1004 and its associated input package lead 1030 (node 521B, FIG. 5). The elements of the device 1000 are similar to their counterpart elements described above in the context of FIG. 5, and accordingly, such common aspects will not be redundantly described here in the context of FIG. 10.

The main amplifier 1002 is preferably realized as one or more transistors formed on a semiconductor substrate (or die) that is mounted or affixed to a metal substrate 1005 (e.g., copper or the like), where the metal substrate 1005 provides an electrical ground reference voltage for the device 1000.

Similarly, the peaking amplifier 1004 also is preferably realized as one or more transistors formed on a semiconductor substrate (or die) that is mounted or affixed to the metal substrate 1005. In this regard, the metal substrate 1005 functions as the primary mounting structure for the amplifiers 1002, 1004 and other components of device 1000 (e.g., the IMN circuitry 1010, 1012, the OMN circuitry 1006, 1008, and the multiple-resonator circuit 1050). In an exemplary embodiment, the main amplifier 1002 is operated in the Class AB mode, and the peaking amplifier 1004 operates in the Class C mode.

The amplified output signal generated by the main amplifier 1002 is present at an output terminal (e.g., the drain terminal) of the main amplifier transistor, and the transistor die includes a conductive contact region formed thereon for connecting to that terminal of the transistor(s). Similarly, the amplified output signal generated by the peaking amplifier 1004 is present at an output terminal (e.g., the drain terminal) of the peaking amplifier transistor, and the transistor die includes a conductive contact region formed thereon for connecting to that terminal of the transistor.

Although various configurations of input and output impedance matching circuitry may be implemented, examples of simple T-match circuits are shown in FIG. 10. In the illustrated example, each main and peaking amplifier IMN circuit 1010, 1012 includes a shunt capacitor 1011, 1013 coupled to the substrate 1005, a first inductive element (e.g., a set of bondwires) coupled between the input lead 1016, 1030 and the shunt capacitor 1011, 1013, and a second inductive element (e.g., a second set of bondwires) coupled between the shunt capacitor 1011, 1013 and an input terminal (e.g., a gate terminal) of the main or peaking amplifier 1002, 1004. Similarly, each main and peaking amplifier output matching circuit 1006, 1008 includes a shunt capacitor 1007, 1009 coupled to the substrate 1005, a first inductive element (e.g., a set of bondwires) coupled between an output terminal (e.g., a drain terminal) of the main or peaking amplifier 1002, 1004 and the shunt capacitor 1007, 1009, and a second inductive element (e.g., a second set of bondwires) coupled between the shunt capacitor 1007, 1009 and the output lead 1018, 1032. As illustrated, each of the main amplifier input and output impedance matching circuitry 1010, 1006 and the peaking amplifier input and output impedance matching circuitry 1012, 1008 is realized as a low-pass impedance matching circuit topology. In other embodiments, some or all of the impedance matching circuits 1006, 1008, 1010, 1012 could be replaced with high-pass or bandpass impedance matching circuit topologies.

According to an embodiment, multiple-resonator circuit 1050 has at least three ports 1042-1044 (e.g., ports 102-104 of FIG. 1, ports 202-204 of FIG. 2, or ports 542-544 of FIG. 5), which are shown to be implemented as bonding pads on the top surface of circuit 1050 in FIG. 10. The output terminals (e.g., drain terminals) of the main and peaking amplifiers 1002, 1004 are coupled to first and second ports 1042, 1043 (e.g., ports 542, 543, FIG. 5) of the multi-resonator circuit 1050, respectively. The output terminals of the main and peaking amplifiers 1002, 1004 may be directly coupled to the first and second ports (e.g., through one or more wirebonds, as shown in FIG. 10), or the output terminals may be coupled to the first and second ports through one or more components of the OMN circuits 1006, 1008 and/or other conductors. The third port (e.g., port 544, FIG. 5) of the multi-resonator circuit 1050 is coupled to the electrical ground reference voltage (e.g., to substrate 1005), through a capacitor (e.g., capacitor 552, FIG. 5) and/or other circuitry to the ground reference voltage. In some cases, connection between the third port and the ground reference voltage may be achieved with one or more wirebonds, as shown, or with other types of conductors and/or components.

The connection of the multiple-resonator circuit 1050 and the amplifiers 1002, 1004 may differ from the example shown. For example, the multiple-resonator circuit 1050 may be connected to the gate or other input terminals of the amplifiers 1002, 1004. The connection may reduce gate baseband impedance. The connection may be useful in connection with digital pre-distortion scenarios.

The device 1000 of FIG. 10 represents only part of a multi-path amplifier (e.g., a Doherty or other type of amplifier). The device 1000 may be physically and electrically connected to a printed circuit board or other substrate (e.g., substrate 902, FIG. 9) that supports other components of the amplifier (e.g., splitter 518, combiner 520, and so on).

Other combinations of the various features and aspects of the embodiments described above may also be provided. One or more features or aspects of one embodiment may be combined with one or more features or aspects of another embodiment, even though the resulting combination is not expressly described or identically shown in the figures. For instance, the resonator arrangements in other embodiments may combine aspects of the above-described examples such that the resonator arrangements include both microstrip-based inductors and surface-mount inductors.

The above-described circuits and devices include a multiple-resonator arrangement to achieve, among other things, decreased baseband impedance, and increased video bandwidth. In contrast to devices merely having a single resonator in, for instance, a bias feed, the above-described devices use multiple resonators coupled to output circuitry (e.g., output matching circuitry) of the RF power devices. The multiple resonators are arranged and otherwise configured to provide higher video bandwidth for a power amplifier (e.g., an n-path power amplifier), which, in turn, supports improved digital pre-distortion linearization of the power amplifier.

The above-described circuits and devices provides enhanced video bandwidth (VBW) for multiple-path amplifiers, including, but not limited to Doherty power amplifiers, which in turn allows the amplifier with associated linearization scheme to support higher signal bandwidths. RF power amplifier VBW is a useful limitation in being able to support linear amplification of higher signal bandwidths (SBW) by virtue of the fact that limited VBW introduces memory effects that impair performance of linearization schemes such as digital pre-distortion (DPD). The innovation provides a method to enhance RF power amplifier VBW, thereby reducing impairment on DPD linearization.

The above-described circuits and devices also provide for a compact structure that is capable of saving PCB real-estate and also allow multiple DC and low frequency paths to be paralleled while maintaining required levels of inter-stage isolation at RF frequencies. The techniques may be implemented directly on PCB using surface mount components, as a separate multi-port component, or using an in-package integrated passive device (IPD).

Although described as useful in connection with increased video bandwidth, the disclosed devices may be useful in a variety of other contexts and applications. The devices are also not limited to any particular application or type of RF signal.

In a first aspect, a circuit includes a first amplifier path configured to carry a first radio frequency signal, a second amplifier path configured to carry a second radio frequency signal, a first resonator connected to the first and second amplifier paths, the first resonator being configured to resonate at a radio frequency to isolate the first and second radio frequency signals from one another and further configured to pass signals at a baseband frequency, and a second resonator coupling the first resonator and a reference voltage node, the second resonator being configured to resonate at the radio frequency and to pass the signals at the baseband frequency to the reference voltage node.

In a second aspect, a device includes first, second, and third ports, a first resonator coupling the first and second ports, the first resonator being configured to resonate at a radio frequency to provide radio frequency isolation between the first and second ports in a radio frequency range above the baseband frequency, and a second resonator coupling the first resonator and the third port. The second resonator is configured to pass signals at the baseband frequency to the third port.

In a third aspect, a circuit includes a first resonator configured to resonate at a radio frequency to provide radio frequency isolation in a radio frequency range above a baseband frequency, and a second resonator coupled to the first resonator, the second resonator being configured to resonate at the radio frequency. The first and second resonators are configured to pass signals at the baseband frequency.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A circuit comprising:
   a first amplifier path configured to carry a first radio frequency signal;
   a second amplifier path configured to carry a second radio frequency signal;
   a first resonator connected to the first and second amplifier paths, the first resonator being configured to resonate at a radio frequency to isolate the first and second radio frequency signals from one another and further configured to pass signals at a baseband frequency; and
   a second resonator coupling the first resonator and a reference voltage node, the second resonator being configured to resonate at the radio frequency and to pass the signals at the baseband frequency to the reference voltage node.

2. The circuit of claim 1, further comprising a capacitor coupling the second resonator to the reference voltage node.

3. The circuit of claim 1, further comprising:
   a first amplifier configured to generate the first radio frequency signal on the first amplifier path; and
   a second amplifier configured to generate the second radio frequency signal on the second amplifier path.

4. The circuit of claim 3, wherein:
   the first amplifier path comprises an output conduction terminal of the first amplifier to which the first resonator is electrically tied; and
   the second amplifier path comprises an output conduction terminal of the second amplifier to which the first resonator is electrically tied.

5. The circuit of claim 3, wherein the first and second amplifiers are disposed in a Doherty amplifier arrangement.

6. The circuit of claim 1, further comprising:
   a third resonator coupling the first amplifier path to the reference voltage node; and
   a fourth resonator coupling the second amplifier path to the reference voltage node.

7. The circuit of claim 1, further comprising a bias feed node, wherein the second resonator and the capacitor are connected to one another at the bias feed node.

8. The circuit of claim 7, wherein the bias feed node is connected to one of the first and second amplifier paths via the first resonator.

9. The circuit of claim 1, wherein the first resonator, the second resonator, or both the first and second resonators comprise a microstrip inductor.

10. The circuit of claim 1, further comprising a package in which the first resonator and the second resonator are enclosed.

11. The circuit of claim 1, wherein the reference voltage node is a ground node.

12. The circuit of claim 1, further comprising a bias feed common to, and coupled with, both the first and second amplifier paths.

13. A device comprising:
    first, second, and third ports;
    a first resonator coupling the first and second ports, the first resonator being configured to resonate at a radio frequency to provide radio frequency isolation between the first and second ports in a radio frequency range above a baseband frequency; and
    a second resonator coupling the first resonator and the third port;
    wherein the second resonator is configured to pass signals at the baseband frequency to the third port.

14. The device of claim 13, wherein the first resonator is configured to pass signals at the baseband frequency.

15. The device of claim 13, wherein the first resonator, the second resonator, or both the first and second resonators comprise a microstrip inductor.

16. The device of claim 13, further comprising a package in which the first resonator and the second resonator are enclosed.

17. The device of claim 16, further comprising:
    a first amplifier configured to generate a first radio frequency signal at the first port;
    a second amplifier configured to generate a second radio frequency signal at the second port;
    wherein the first and second amplifiers are enclosed in the package.

18. A circuit comprising:
    a first resonator configured to resonate at a radio frequency to provide radio frequency isolation in a radio frequency range above a baseband frequency; and
    a second resonator coupled to the first resonator, the second resonator being configured to resonate at the radio frequency;
    wherein the first and second resonators are configured to pass signals at the baseband frequency.

19. The circuit of claim 18, further comprising one or more further resonators disposed in parallel with the first resonator.

20. The circuit of claim 18, further comprising one or more further resonators disposed in parallel with the second resonator.

\* \* \* \* \*